US009147457B2

(12) United States Patent
Kim et al.

(10) Patent No.: US 9,147,457 B2
(45) Date of Patent: Sep. 29, 2015

(54) REFERENCE CELL REPAIR SCHEME

(75) Inventors: Jung Pill Kim, San Diego, CA (US); Taehyun Kim, San Diego, CA (US); Sungryul Kim, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 23 days.

(21) Appl. No.: 13/613,038

(22) Filed: Sep. 13, 2012

(65) Prior Publication Data

US 2014/0071738 A1 Mar. 13, 2014

(51) Int. Cl.

| | |
|---|---|
| ***G11C 11/00*** | (2006.01) |
| ***G11C 11/16*** | (2006.01) |
| ***G11C 29/00*** | (2006.01) |

(52) U.S. Cl.

CPC .............. *G11C 11/16* (2013.01); *G11C 11/165* (2013.01); *G11C 29/787* (2013.01); *G11C 29/832* (2013.01)

(58) Field of Classification Search

USPC .......................................................... 365/158

See application file for complete search history.

(56) References Cited

U.S. PATENT DOCUMENTS

| | | | | |
|---|---|---|---|---|
| 6,404,671 | B1 * | 6/2002 | Reohr et al. | 365/158 |
| 6,898,113 | B2 | 5/2005 | Tsuji | |
| 7,747,926 | B2 | 6/2010 | Wise et al. | |
| 2002/0093032 | A1 | 7/2002 | Hanzawa et al. | |
| 2004/0080986 | A1 * | 4/2004 | Hanzawa et al. | 365/189.02 |
| 2008/0310218 | A1 | 12/2008 | Hachino | |
| 2010/0046274 | A1 | 2/2010 | Tsuchida et al. | |
| 2011/0194333 | A1 | 8/2011 | Kim et al. | |
| 2012/0044755 | A1 | 2/2012 | Kim et al. | |
| 2012/0257437 | A1 * | 10/2012 | Seko et al. | 365/148 |

FOREIGN PATENT DOCUMENTS

| | | | |
|---|---|---|---|
| JP | 2008171478 | A | 7/2008 |

OTHER PUBLICATIONS

Partial International Search Report—PCT/US2013/059808—ISA/EPO—Dec. 19, 2013.

International Search Report and Written Opinion—PCT/US2013/059808—ISAEPO—Apr. 11, 2014.

* cited by examiner

*Primary Examiner* — Anthan Tran

(74) *Attorney, Agent, or Firm* — Donald D. Min

(57) ABSTRACT

In a magnetic random access memory (MRAM), numerous arrays of reference bit cells are coupled together by coupling their respective bit lines to a merged reference node. Pass gate circuitry coupled between the respective reference bit lines and the merged reference node is configured for selectively coupling or decoupling one or more of the reference bit lines to and from the merged reference node. The pass gate circuitry is controllable by programming one-time programmable devices coupled to the pass gate circuitry. The one-time programmable devices can be programmed to decouple flawed arrays of reference bit cells from the merged reference node or to select between redundant arrays of reference bit cells for coupling to the reference node.

17 Claims, 10 Drawing Sheets

REFERENCE CELL REPAIR SCHEME

TECHNICAL FIELD

The present disclosure relates generally to magnetic random-access memory (MRAM) reference cell configurations. More specifically, the disclosure relates to configuring merged reference bit line schemes for MRAM.

BACKGROUND

Unlike conventional random access memory (RAM) chip technologies, in magnetic RAM (MRAM) data is not stored as electric charge, but is instead stored by magnetic polarization of storage elements. The storage elements are formed from two ferromagnetic layers separated by a tunneling layer. One of the two ferromagnetic layers, which is referred to as the fixed layer or pinned layer, has a magnetization that is fixed in a particular direction. The other ferromagnetic magnetic layer, which is referred to as the free layer, has a magnitization direction that can be altered to represent either a "1" when the free layer magnetization is anti-parallel to the fixed layer magnitization or "0" when the free layer magnetization is parallel to the fixed layer magnitization, or vice versa. One such device having a fixed layer, a tunneling layer, and a free layer is a magnetic tunnel junction (MTJ). The electrical resistance of an MTJ depends on whether the free layer magnitization and fixed layer magnitization are parallel or anti-parallel with each other. A memory device such as MRAM is built from an array of individually addressable MTJs.

To write data in a conventional MRAM, a write current, which exceeds a critical switching current, is applied through an MTJ. The write current exceeding the critical switching current is sufficient to change the magnetization direction of the free layer. When the write current flows in a first direction, the MTJ can be placed into or remain in a first state, in which its free layer magnetization direction and fixed layer magnetization direction are aligned in a parallel orientation. When the write current flows in a second direction, opposite to the first direction, the MTJ can be placed into or remain in a second state, in which its free layer magnetization and fixed layer magnetization are in an anti-parallel orientation.

To read data in a conventional MRAM, a read current may flow through the MTJ via the same current path used to write data in the MTJ. If the magnetizations of the MTJs free layer and fixed layer are oriented parallel to each other, the MTJ presents a resistance that is different than the resistance the MTJ would present if the magnetizations of the free layer and the fixed layer were in an anti-parallel orientation. In a conventional MRAM, two distinct states are defined by two different resistances of an MTJ in a bitcell of the MRAM. The two different resistances represent a logic 0 and a logic 1 value stored by the MTJ.

To determine whether data in a conventional MRAM represents a logic 1 or a logic 0, the resistance of the MTJ in the bitcell is compared with a reference resistance. The reference resistance in conventional MRAM circuitry is a midpoint resistance between the resistance of an MTJ having a parallel magnetic orientation and an MTJ having an anti-parallel magnetic orientation. One way of generating a midpoint reference resistance is coupling in parallel an MTJ known to have a parallel magnetic orientation and an MTJ known to have an anti-parallel magnetic orientation.

Bitcells of a magnetic random access memory may be arranged in one or more arrays including a pattern of memory elements (e.g., MTJs in case of MRAM), STT-MRAM (Spin-Transfer-Torque Magnetic Random Access Memory) is an emerging nonvolatile memory that has advantages of non-volatility, comparable speed to eDRAM (Embedded Dynamic Random Access Memory), smaller chip size compared to eSRAM (Embedded Static Random Access Memory), unlimited read/write endurance, and low array leakage current.

SUMMARY

In accordance with an aspect of the disclosure, a memory apparatus is presented. The apparatus includes a first reference cell including a first reference magnetic tunnel junction (MTJ) coupled to a first reference bit line. The apparatus further includes a second reference cell including a second reference MTJ coupled to a second reference bit line. The apparatus also includes a word line coupled to the first reference cell and to the second reference cell. The apparatus still further includes programmable switching circuitry configured to selectively de-couple the first reference bit line from a merged reference node.

In accordance with another aspect of the disclosure, a memory apparatus is presented. The apparatus includes a first reference cell including a first reference magnetic tunnel junction (MTJ) coupled to a first reference bit line. The apparatus also includes a redundant reference cell including a redundant reference MTJ coupled to a redundant reference bit line. The apparatus further includes a word line coupled to the first reference cell and to the redundant reference cell. The apparatus still further includes programmable switching circuitry configured to selectively de-couple the first reference bit line from a merged reference node and couple the redundant reference bit line to the merged reference node.

In accordance with yet another aspect a method for reconfiguring a memory is presented. The method includes identifying a flawed array of reference cells coupled to a reference bit line in a merged bit line system. The method also includes changing a programmed state of a programmable device in response to identifying the flawed array of reference cells. The method further includes decoupling the reference bit line from a merged reference node in response to the changed programmed state.

In accordance with still another aspect, a memory apparatus has means for identifying a flawed array of reference cells coupled to a reference bit line in a merged bit line system. The apparatus also includes means for changing a programmed state of a programmable device in response to identifying the flawed array of reference cells. The apparatus further includes means for decoupling the reference bit line from a merged reference node in response to the changed programmed state.

In accordance with another aspect, a computer program product is presented. The computer program includes a non-transitory computer-readable medium having non-transitory program code recorded thereon. The program code includes program code to identify a flawed array of reference cells coupled to a reference bit line in a merged bit line system. The program code also includes program code to change a programmed state of a programmable device in response to identifying the flawed array of reference cells. The program code further includes program code to decouple the reference bit line from a merged reference node in response to the changed programmed state.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

The features, nature, and advantages of the present disclosure will become more apparent from the detailed description set forth below when taken in conjunction with the drawings.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Unlike conventional random access memory (RAM) chip technologies, in magnetic RAM (MRAM) data is not stored as electric charge, but is instead, stored by magnetic polarization of storage elements. The storage elements are formed from two ferromagnetic layers separated by a tunneling layer. One of the two ferromagnetic layers, which is referred to as the fixed layer or pinned, layer, has a magnetization that is fixed in a particular direction. The other ferromagnetic magnetic layer, which is referred to as the free layer, has a magnitization direction that can be altered to represent either a "1" when the free layer magnetization is anti-parallel to the fixed layer magnitization or "0" when the free layer magnetization is parallel to the fixed layer magnitization or vice versa. One such device having a fixed layer, a tunneling layer, and a free layer is a magnetic tunnel junction (MTJ). The electrical resistance of an MTJ depends on whether the free layer magnitization and fixed layer magnitization are parallel or anti-parallel with each other. A memory device such as MRAM is built from an array of individually addressable MTJs.

An MRAM reference cell generates a reference level (Vref) to compare with an MRAM cell data to determine whether the resistance MRAM cell is a parallel state (Rp), e.g., "0," or an anti-parallel state (Rap), e.g., "1." The MRAM reference cell includes two MRAM cells, one cell is in a parallel state and the other cell is in an anti-parallel state.

Figure 1:
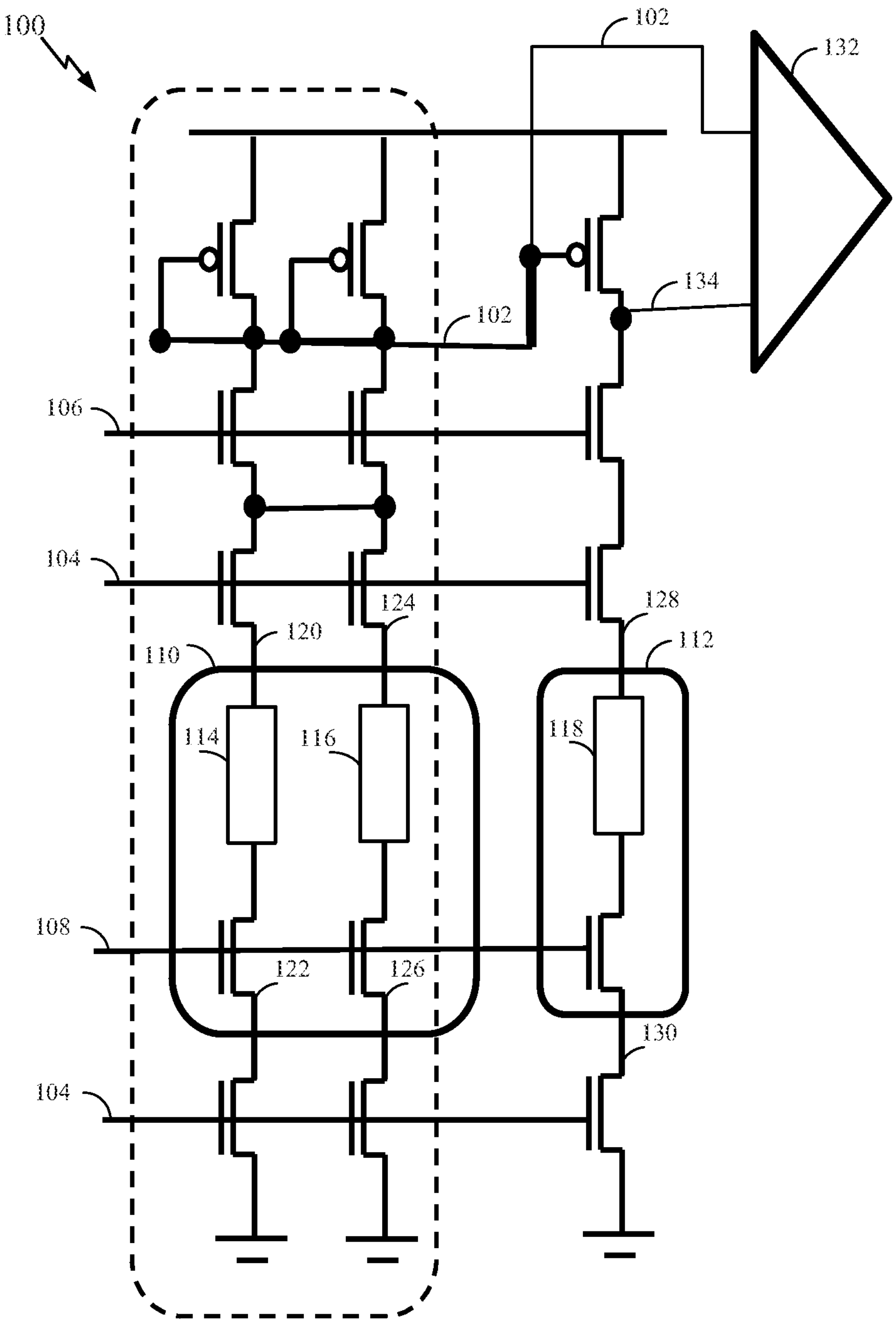
FIG. 1 illustrates a magnetic random access memory (MRAM) reference system.

The MRAM reference system includes reference cells and other circuitry for generating a reference level from reference cells. FIG. 1 illustrates an MRAM system 100 according to an aspect of the present disclosure. As illustrated in FIG. 1, the MRAM system includes a Vref line 102 to carry the Vref, a clamp voltage (VCLAMP) line 106 for limiting the voltage, read selection lines (RSEL) 104, and a word line (WL) 108. The MRAM system of FIG. 1 further includes an MRAM reference cell 110 and an MRAM data cell 112.

The MRAM reference cell 110 includes a first reference MTJ in a parallel state 114 (Rp) coupled between a read bit line for the parallel state 120 (RBLp) and a read source line for the parallel state 122 (RSLp). The MRAM reference cell 110 also includes a second reference MTJ 116 in an anti-parallel state (Rap) coupled between a read bit line for the anti-parallel state 124 (RBLap) and a read source line for the anti-parallel state 126 (RSLap). The MRAM data cell includes an MTJ 118 (Rmtj) coupled between a bit line 128 (BL) and a source line 130 (SL). Finally, the MRAM system includes a sense amplifier 132 coupled to a data line 134 and the Vref line 102.

Figure 2:
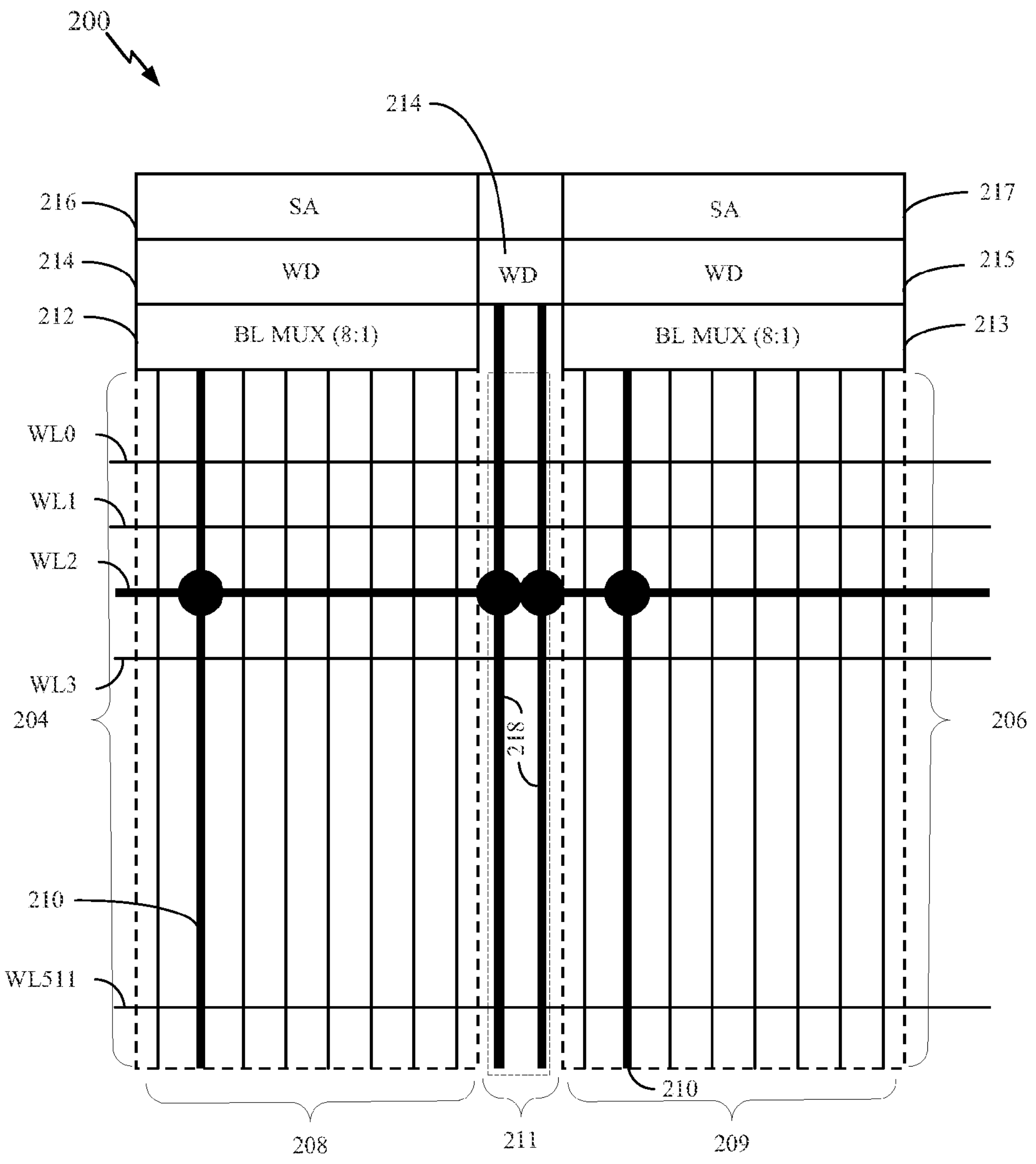
FIG. 2 illustrates an MRAM reference hit line scheme.

FIG. 2 illustrates an example of an MRAM reference bit line scheme 200 including a first array of data cells 204 and a second array of data cells 206. The first array of data cells 204 is coupled to a first set of bit lines 208, first sense amplifier circuitry 216, first write driver circuitry 214 and first bit line multiplexer circuitry 212. The second array of data cells 206 is coupled to a second set of bit lines 209, second sense amplifier circuitry 217, second write driver circuitry 215 and second bit line multiplexer circuitry 213.

The MRAM reference bit line scheme 200 also includes an array of reference cells 211 coupled to a pair or reference bit lines 218 and to reference cell write driver circuitry 214. One of the pair of reference bit lines 218 is coupled to reference cells in the parallel state (Rp) in each reference cell. The other of the pair of reference bit lines 218 is coupled to reference cells in the anti-parallel state (Rap) in each reference cell 211. The first array of data cells 204, the second array of data cells 206 and the array of reference cells 211 are coupled to word lines WL0-WL511. In this example, 512 word lines 207 are coupled to the first array of data cells 204, the second array of data cells 206 and the array of reference cells 211. Or course fewer or more word lines could be provided.

As illustrated in FIG. 2, a bit line 210 is selected for each reference MTJ. That is, a read voltage may be applied to a word (WL2) and s sensing voltage may also be applied to each bit line 210 and each reference bit line 218. The current flowing through each activated bit line 210 and each reference bit line 218 is compared by each sense amplifier 216 217 so that each sense amplifier 216 217 reads the two currents and outputs one bit. More specifically, FIG. 2 illustrates the intersection of an activated word line (WL2) with the bit lines 210 and the reference bit lines 218 for the first array of data cells 204 and the second array of data cells 206.

In the MRAM reference bit line scheme 200, a reference cell can be used by more than one data cell. For example, any of the data cells coupled to a word line can be activated by the word line along with an Rp reference cell and an Rap reference cell coupled to the same word line. In this example of an MRAM reference bit line scheme, each reference cell is shared between 16 data cells, in which 8 of the 16 data cells are in the first array of data cells 204 and 8 of the 16 data cells are in the second array of data cells 206.

Figure 3:
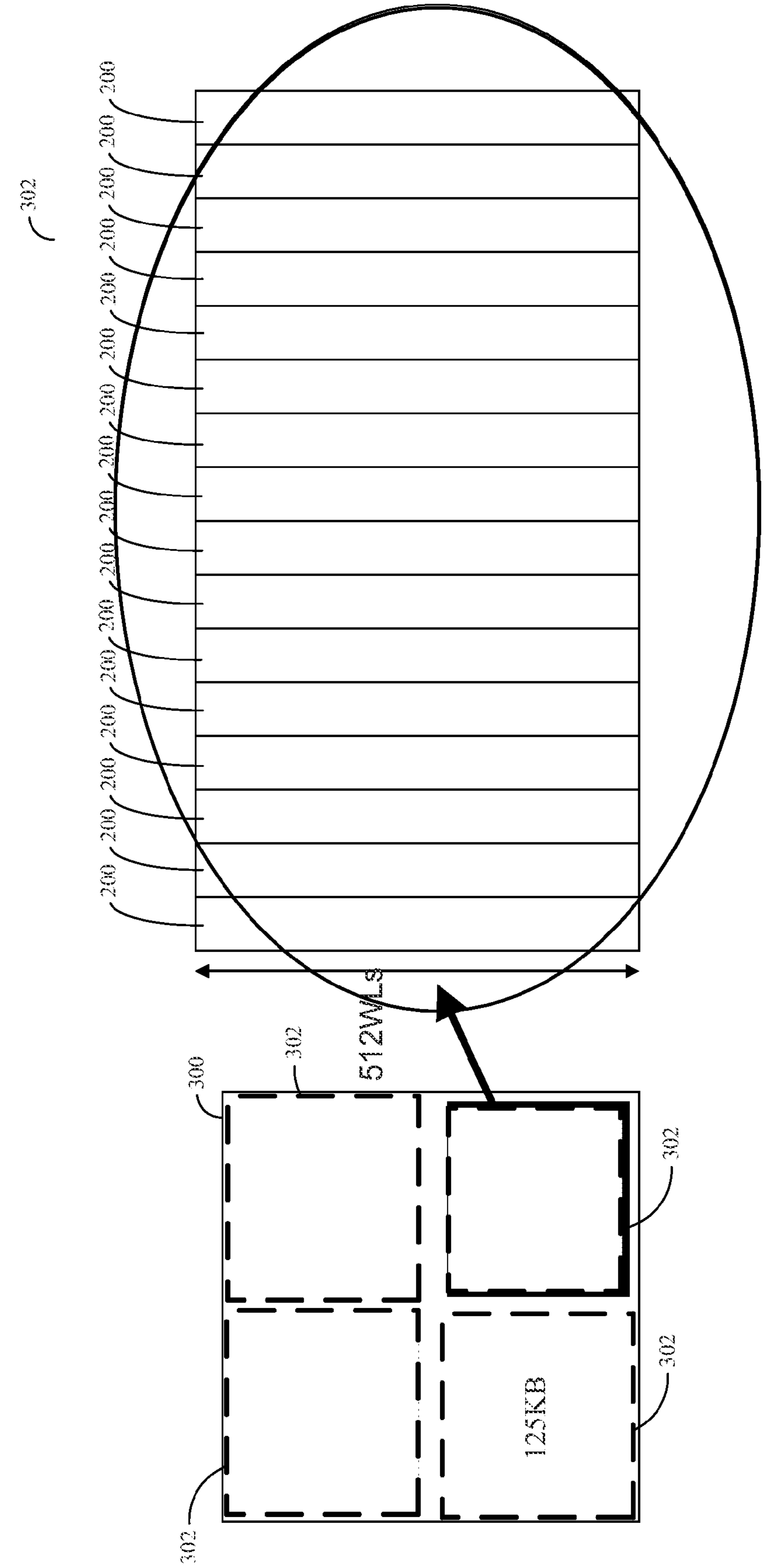
FIG. 3 illustrates an MRAM macro including multiple blocks of MRAM reference bitline schemes.

The word lines WL0-WL511 in the MRAM reference bit line scheme can be coupled to additional arrays of data cells and additional arrays of data cells to form a larger MRAM macro. For example, the MRAM reference bit line scheme 200 can be replicated 16 times along the 512 word lines WL0-WL511 to form a 125 kilobit (Kb) MRAM macro. FIG. 3 illustrates an example of a 0.5 Mb MRAM macro 300 in which each 125 Kb block 302 includes 16 of the MRAM reference bit line schemes 200 shown in FIG. 2. Thus, each 125 Kb block 302 in the 0.5 Mb MRAM macro 300 includes 32 arrays of data cells having eight data bit lines each and 16 arrays of reference cells having two reference bit lines each coupled along 512 word lines. Of course, other size memories are contemplated, and the disclosure is not limited to this configuration.

Figure 4:
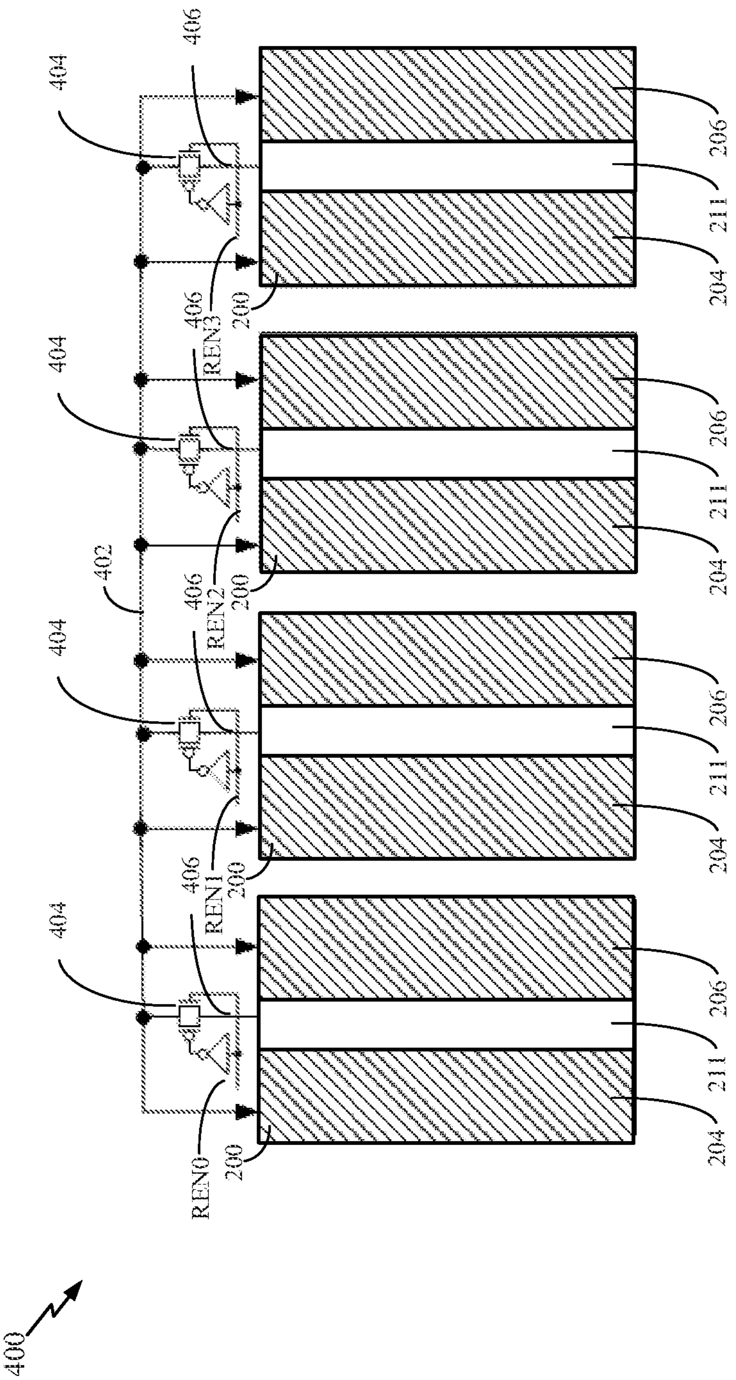
FIG. 4 illustrates a merged reference bitline scheme according to aspects of the present disclosure.

FIG. 4 illustrates a merged reference bit line scheme according to aspects of the present disclosure. The merged reference bit line scheme includes four of the MRAM reference bit line schemes 200 shown in FIG. 2. The four arrays of reference cells 211 in the MRAM reference bit line schemes 200 are coupled together to provide a merged reference level. In this configuration, the reference bit lines in each of the arrays of reference cells 211 that are coupled to RP reference cells may be coupled together to provide a merged RP reference level. The reference bit lines that are coupled to Rap reference cells may be coupled together to generate a merged Rap reference level. For clarity of illustration, only one of the two reference bit lines 406 in each reference cell array is shown coupled to a merged reference node 402. The merged reference levels may be used with data cells in any of the data cell arrays 204, 206. Yield is improved by merging the reference cells due to an improved statistical variation of the merged cells.

In the merged reference bit line scheme, the merged reference level may be flawed or invalid due to a bad reference cell coupled to one of the reference bit lines 406, for example. According to aspects of the present disclosure, flawed MRAM reference cells may be selectively decoupled from the merged reference bit line scheme by reference bit line selection circuitry 404. The reference bit line selection circuitry 404 includes a pass gate coupled between each merged reference node 402 and each corresponding reference bit line 406. According to one aspect of the disclosure, the reference bit line coupled to the Rap reference cells in a reference cell array and the reference bit line coupled to the Rp reference cells in the reference cell array can both be selectively decoupled from the merged reference cell by turning off the pass gate. According to an aspect of the disclosure, the bit line selection circuitry is programmably configured by internal or external one time programmable (OTP) devices or fuses coupled to an enable node (REN0-REN3) of the bit line selection circuitry 404, for example.

Figure 5A:
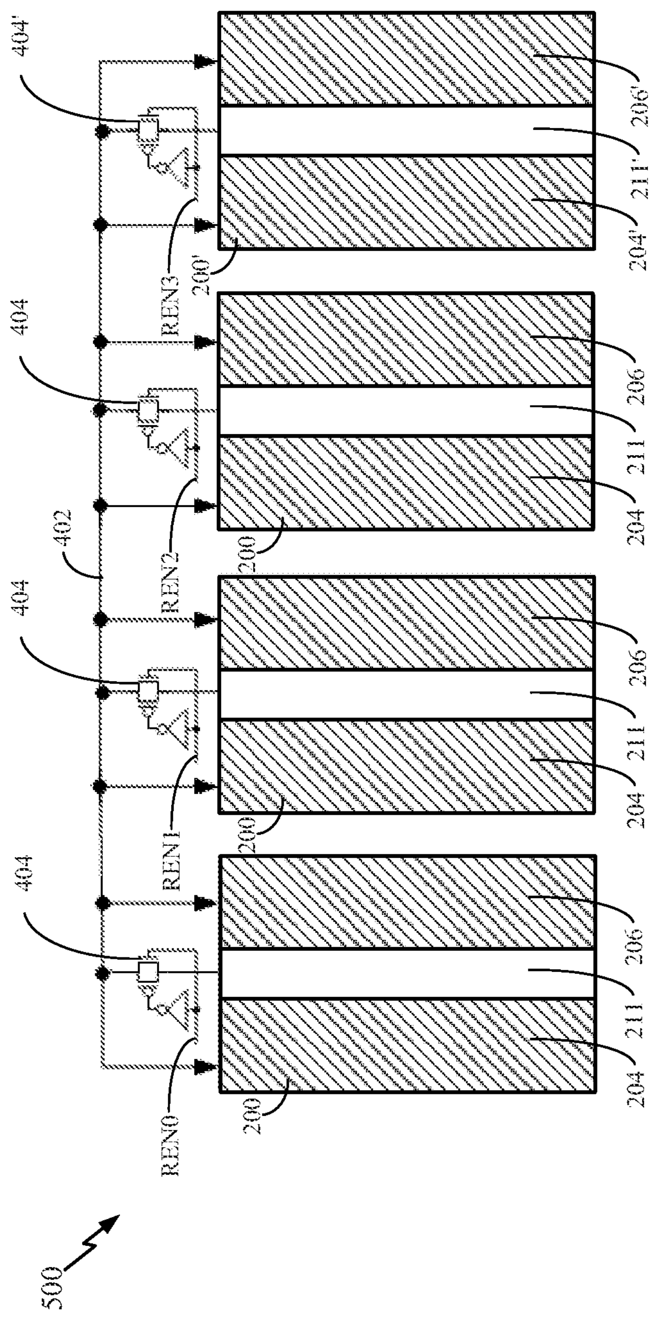
FIG. 5*a* illustrates a repaired merged reference bitline scheme according to an aspect of the present disclosure.

FIG. 5*a* illustrates a merged reference bit line scheme in which one of the arrays reference cells 211' is flawed because it includes one or more flawed MRAM reference cells (not shown), which could skew a reference level on the merged reference node 402, for example. According to aspects of the present disclosure, bit line selection circuitry 404' is configured to decouple the flawed array of reference cells 211' from the merged reference node 402 while leaving three good arrays of reference cells 211 coupled to the merged reference node 402. The flawed array of reference cells 211' may be decoupled from the merged reference node 402 by turning off a pass gate in the bit line selection circuitry 404', for example. This configuration allows the merged reference bit line scheme to remain operable by utilizing the remaining good arrays of reference cells 211. The arrays of data cells 204' and 206' can remain coupled to the merged reference node 402 and may remain operable by using the merged reference level provided by the good arrays of reference cells 211.

Figure 5B:
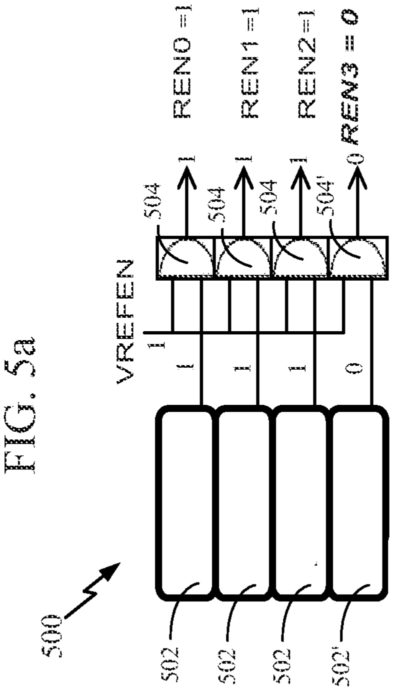
FIG. 5*b* illustrates programmable circuitry for configuring hit line selection circuitry according to an aspect of the present disclosure.

According to aspects of the disclosure, the bit line selection circuitry is programmably configured by internal or external one time programmable (OTP) devices or fuses coupled to an enable node (REN0-REN3) of the bit line selection circuitry 404, 404' for example. FIG. 5*b* illustrates programmable circuitry 500 for configuring the bit line selection circuitry 404, 404' according to an aspect of the present disclosure. The programmable circuitry 500 includes fuses 502, 502' that are each coupled to an input of a respective AND gate 504, 504'. Each fuse 502, 502' is configured to input a logic level 1 to its respective AND gate 504, 504' when it is not blown, i.e., closed, and a logic level 0 to its respective AND gate 504, 504', when it is blown, i.e., open. Although this aspect of the disclosure is described with respect to fuses 502, 502', it should be understood that various other programmable elements such as one time programmable (OTP) MTJ devices, for example, may be substituted for fuses 502, 502' and configured to input the logic level 0 or logic level 1 to the AND gates according to this aspect of the disclosure. A block enable node (VREFEN) for enabling the merged reference node is coupled to another input of each of the AND gates 504, 504'. An output from each of the AND gates 504, 504' is coupled to a respective enable node (REN0-REN3) of the bit line selection circuitry 404.

An enable signal, e.g., a logic level 1, that is asserted on the block enable node (VRFEN) is passed to each corresponding enable node (REN0-REN2) by the AND gates 504 in which a corresponding fuse 502 is not blown. The enable signal is not passed, e.g., a logic level 0 is passed, to each corresponding enable node (REN3) by the AND gate 504' in which a corresponding fuse 502' is blown. The reference bit line selection circuitry 404' is therefore not enabled and the flawed array of reference cells 211' is thereby decoupled from the merged reference node 402 when the corresponding fuse 502' is blown. Selective decoupling any of the arrays of reference cells 211, 211' can be performed in a programming process to blow appropriate fuses or program OTP devices, for example.

The ability to decouple bad reference bit lines as described previously herein with respect to FIGS. 5*a* and 5*b*, facilitates the use of redundant arrays of reference cells and corresponding redundant reference bit lines. The redundant arrays of reference cells and redundant bit cells can be used selectively to replace a flawed array of reference bit cells.

Figure 6A:
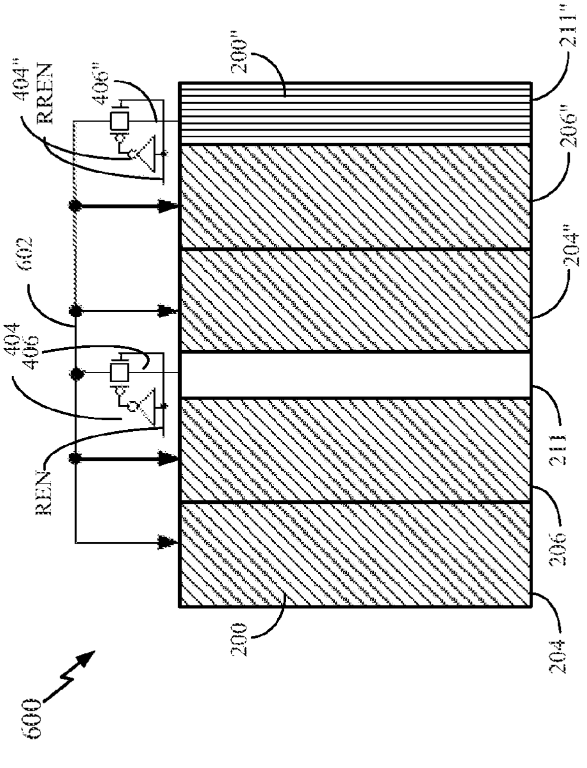
FIG. 6*a* illustrates a redundant reference bitline scheme according to another aspect of the present disclosure.
Figure 6B:
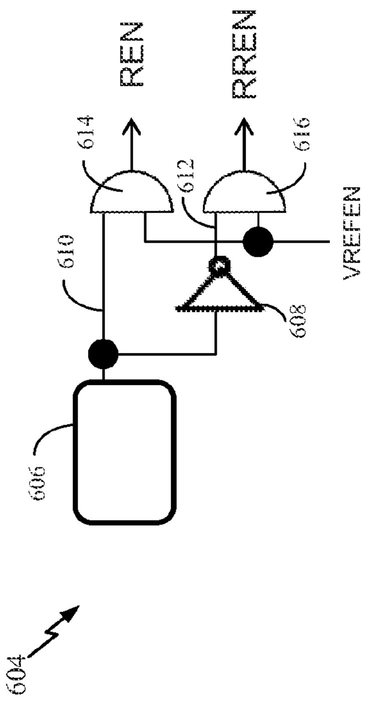
FIG. 6*b* illustrates programmable circuitry configured to couple a redundant array of reference cells to a shared reference node and to decouple another redundant array of reference cells from the shared reference node.

A redundant reference bit line scheme 600 according to another aspect of the present disclosure is shown in FIG. 6*a*. The redundant reference system bit line scheme 600 includes one MRAM reference bit line schemes 200, and a corresponding redundant MRAM reference bit line scheme 200". The reference bit lines 406 of the MRAM reference bit line scheme 200 and the reference bit lines 406" of the redundant MRAM reference bit line scheme 200" are coupled to respective reference bit line selection circuitry 404, 404". The reference bit line selection circuitry 404, 404" is coupled to a shared reference line 602. Data cell arrays 204, 204", 206, 206" are also provided.

Referring to FIG. **6*b*, programmable circuitry 604 is configured to selectively couple the bit fines 406 of the array of reference cells 211 to the shared reference line 602 and decouple the bit lines 406" of the redundant array of reference cell 211" to the shared reference line 602, and vice versa. The programmable circuitry 604 includes a programmable device 606, such as a fuse or OTP MTJ device, coupled to an inverter 608 to provide a programmable enable node 610 and an inverted programmable enable node 612. The programmable enable node 610 is coupled to an input of a first OR gate 614 and the inverted programmable enable Bode 612 is coupled to an input of a second OR gate 616. A block enable node (VREFEN) is coupled to another input of the first OR gate 614 and the second OR gate 616**.

An enable signal, e.g., a logic level 1, that is asserted on the block enable node (VRFEN) is passed to either an enable node (REN) of the array of reference cells 211 or to an enable node (RREN) of the redundant array of reference cells 211". When the programmable device 606 is configured to output a logic level 1, the logic level 1 on the block enable node is passed to the enable node (REN) of the array of reference cells 211 and a logic level 0 is passed to the enable node (RREN) of the redundant array of reference cells 211". When the programmable device 606 is configured to output a logic level 0, the logic level 1 on the block enable node is passed to the enable node (RREN) of the redundant array of reference cells 211" and a logic level 0 is passed to the enable node (REN) of the array of reference cells 211. Thus, the redundant array of reference cells 211' can be coupled to the shared reference line 602 at the same time as a flawed array of reference cells 211 can be decoupled from the shared reference line 602 by programming the programmable device 606, which may be a fuse, an internal OTP device or an external OTP device, for example.

Figure 7:
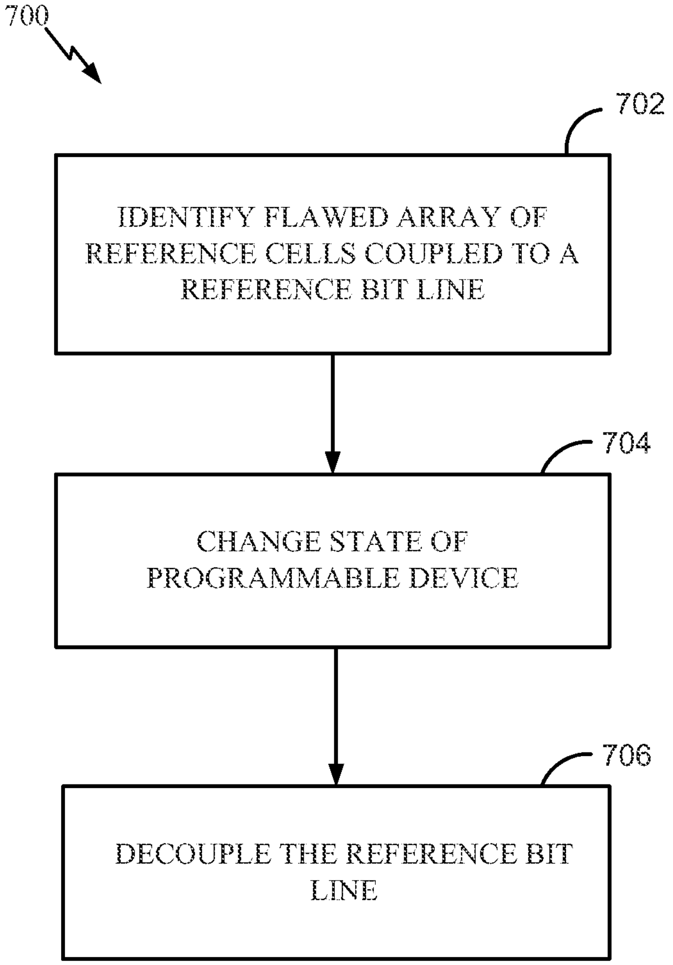
FIG. 7 is process flow diagram illustrating a method for reconfiguring a memory according to an aspect of the present disclosure.

A method for reconfiguring a memory according to an aspect of the disclosure is described with reference to FIG. 7. At block 702, the method includes identifying a flawed array of reference cells coupled to a reference bit line in a merged bit line system. At block 704, the method includes changing the programmed state of a programmable device in response to identifying the flawed array. At block 706, the method includes decoupling the reference bit line from a merged reference node in response to the changed programmed state.

Figure 8:
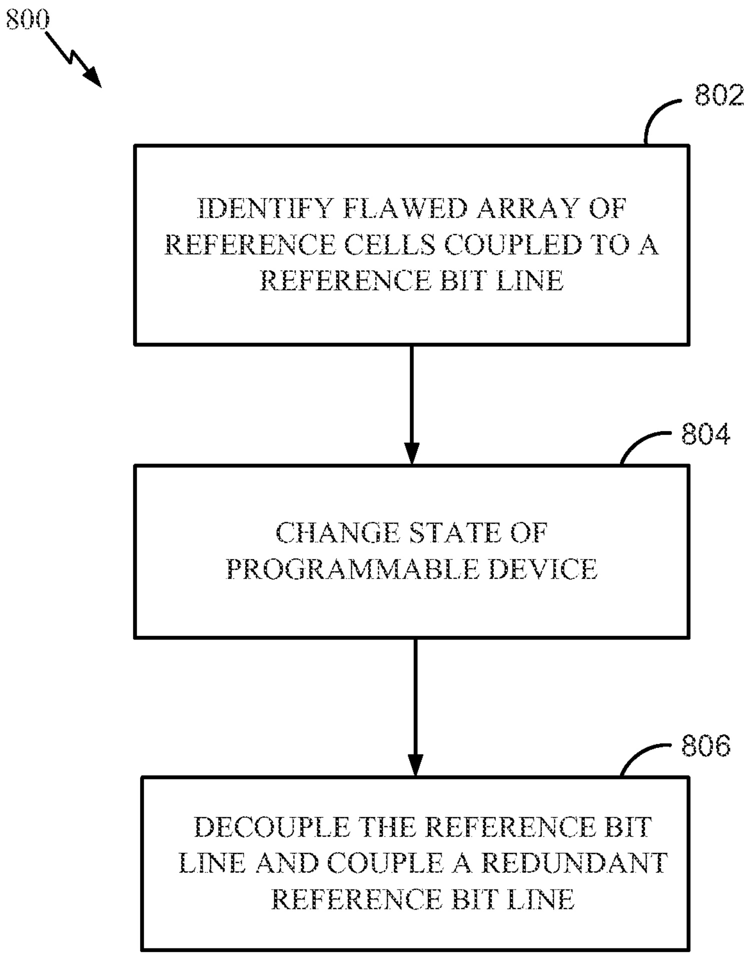
FIG. 8 is process flow diagram illustrating a method for reconfiguring a memory according to another aspect of the present disclosure.

A method for reconfiguring a memory according to another aspect of the disclosure is described with reference to FIG. 8. At block 802, the method includes identifying a flawed array of reference cells coupled to a reference bit line in a merged bit line system. At block 804, the method includes changing the programmed state of a programmable device in response to identifying the flawed array. At block 806, the method includes decoupling the reference bit line from a merged reference node and coupling a redundant reference bit line to the merged reference node in response to the changed programmed state. The redundant reference bit line is coupled to a redundant array of reference cells.

In one configuration, the memory apparatus includes means for identifying a flawed array of reference cells coupled to a reference bit line in a merged bit line system. The means may be the reference bit line selection circuitry 404, the programmable circuitry 500, and/or the programmable device 606 of the MRAM reference bit line scheme 200 configured to perform the functions recited by the identifying means.

The memory apparatus further includes means for changing a programmed state of a programmable device in response to identifying the flawed array of reference cells. The means may be the reference bit line selection circuitry 404, the programmable circuitry 500, the programmable circuitry 604, and/or the programmable device 606 of the MRAM reference bit line scheme 200 configured to perform the functions recited by the changing means.

The memory apparatus still further includes means for decoupling the reference bit line from a merged reference node in response to the changed programmed state. The means may be the reference bit line selection circuitry 404, the programmable circuitry 500, the programmable circuitry 604, and/or the programmable device 606 of the MRAM reference bit line scheme 200 configured to perform the functions recited by the decoupling means.

In another aspect, the aforementioned means may be any module or any apparatus configured to perform the functions recited by the aforementioned means.

Figure 9:
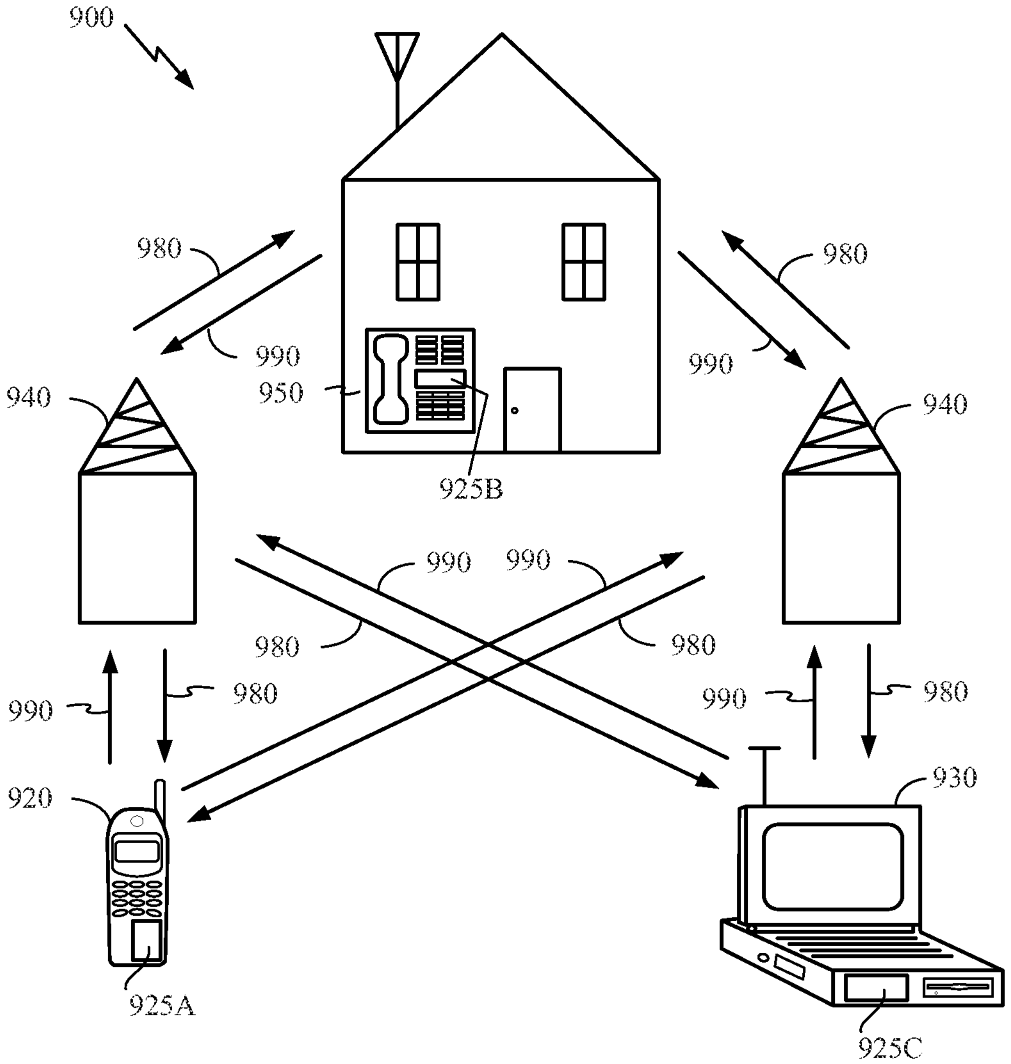
FIG. 9 illustrates an exemplary wireless communication system in which an embodiment of the disclosure may be advantageously employed.

FIG. 9 shows an exemplary wireless communication system in which an embodiment of the disclosure may be advantageously employed. For purposes of illustration, FIG. 9 shows three remote units 920, 930, and 950 and two base stations 940. It will be recognized that wireless communication systems may have many more remote units and base stations. Remote units 920, 930, and 950 include MRAM 925A, 925B, 925C including programmable merged reference bit line schemes according to aspects of the present disclosure. FIG. 9 shows forward link signals 980 from the base stations 940 and the remote units 920, 930, and 950 and reverse link signals 990 from the remote units 920, 930, and 950 to base stations 940.

In FIG. 9, the remote unit 920 is shown as a mobile telephone, remote unit 930 is shown as a portable computer, and remote unit 950 is shown as a fixed location remote unit in a wireless local loop system. For example, the remote units may be cell phones, hand-held personal communication systems (PCS) units, a set top box, a music player, a video player, an entertainment unit, a navigation device, portable data units, such as personal data assistants, or fixed location data units such as meter reading: equipment. Although FIG. 9 illustrates remote units, which may employ MRAM 925A, 925B, 925C including a programmable merged reference bit line scheme according to the teachings of the disclosure, the disclosure is not limited to these exemplary illustrated units. For instance, MRAM including one or more of the merged reference bit line schemes disclosed herein may be suitably employed in any device.

Figure 10:
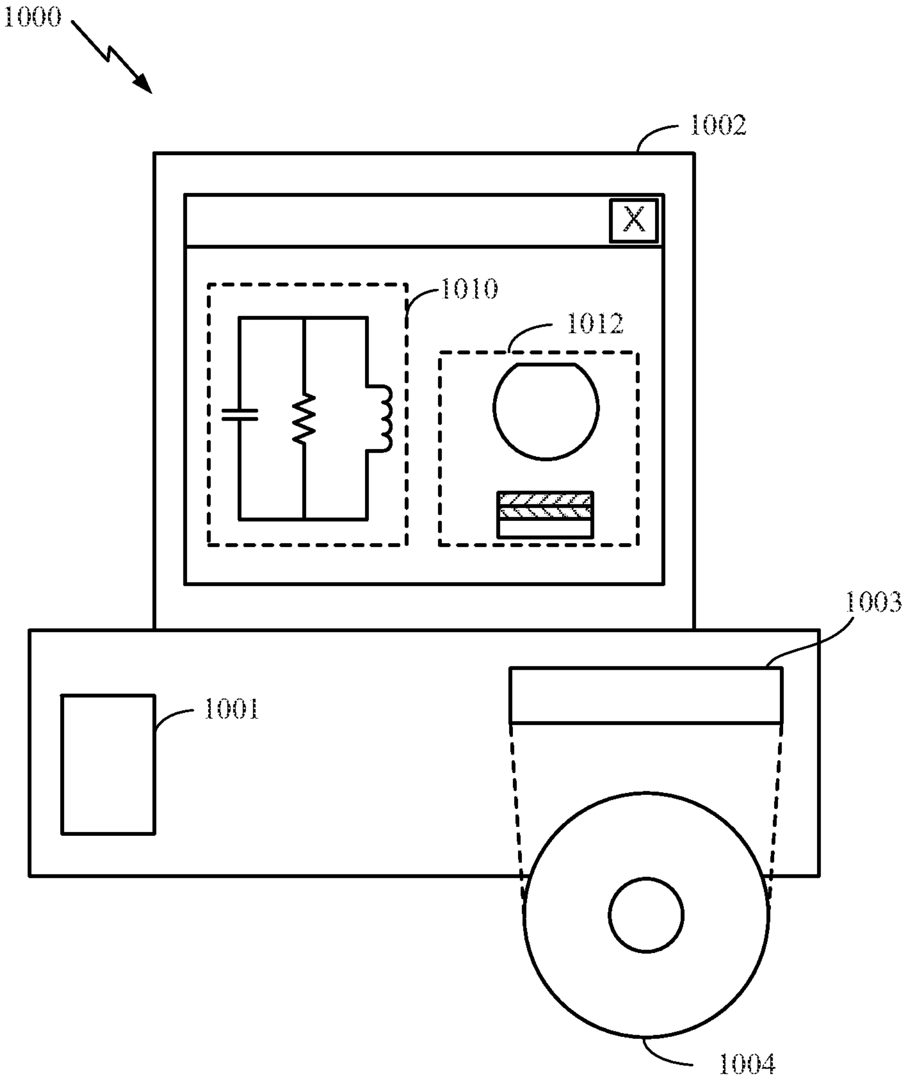
FIG. 10 is a block diagram illustrating a design workstation used for circuit, layout, and logic design of a semiconductor component according to one aspect of the present disclosure.

FIG. 10 is a block diagram illustrating a design workstation used for circuit, layout, and logic design of a semiconductor component, such as one or more of the MRAM merged reference bit line schemes disclosed above. A design workstation 1000 includes a hard disk 1001 containing operating system software, support files, and design software such as Cadence or OrCAD. The design workstation 1000 also includes a display 1002 to facilitate design of a circuit 1010 or a semiconductor component 1012 such as one or more of the MRAM merged reference bit line schemes. A storage medium 1004 is provided for tangibly storing the circuit design 1010 or the semiconductor component 1012. The circuit design 1010 or the semiconductor component 1012 may be stored on the storage medium 1004 in a file format such as GDSII or GERBER. The storage medium 1004 may be a CD-ROM, DVD, hard disk, flash memory, or other appropriate device. Furthermore, the design workstation 1000 includes a drive apparatus 1003 for accepting input from or writing output to the storage medium 1004.

Data recorded on the storage medium 1004 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 1004 facilitates the design of the circuit design 1010 or the semiconductor component 1012 by decreasing the number of processes for designing semiconductor wafers.

Although specific circuitry has been set forth, it will be appreciated by those skilled in the art that not all of the disclosed circuitry is required to practice the disclosed embodiments. Moreover, certain well known circuits have not been described, to maintain focus on the disclosure.

The methodologies described herein may he implemented by various means depending upon the application. For example, these methodologies may be implemented in hardware, firmware, software, or any combination thereof. For a hardware implementation, the processing units may he implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, electronic devices, other electronic units designed to perform the functions described herein, or a combination thereof.

For a firmware and/or software implementation, the methodologies may be implemented with modules (e.g., procedures, functions, and so on) that perform the functions described herein. Any machine or computer readable medium tangibly embodying instructions may be used in implementing the methodologies described herein. For example, software code may be stored in a memory and executed by a processor. When executed by the processor, the executing software code generates the operational environment that implements the various methodologies and functionalities of the different aspects of the teachings presented herein. Memory may be implemented within the processor or external to the processor. As used herein, the term "memory" refers to any type of long term, short term, volatile, nonvolatile, or other memory and is not to be limited to any particular type of memory or number of memories, or type of media upon which memory is stored.

The machine or computer readable medium that stores the software code defining the methodologies and functions described herein includes physical computer storage media. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to store desired program code in the form of instructions or data structures and that can be accessed by a computer. As used herein, disk and/or disc includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present teachings and their advantages have been described in detail, it should be understood that various changes, substitutions and alterations can be made herein without departing from the technology of the teachings as defined by the appended claims. Moreover, the scope of the present application is not intended to be limited to the particular aspects of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding aspects described herein may be utilized according to the present teachings. Accordingly, the appended claims are intended to include within their scope such processes, machines, manufacture, compositions of matter, means, methods, or steps.

What is claimed is:

1. A memory apparatus comprising:

a first reference cell in a first array of reference cells, the first reference cell including a first reference magnetic tunnel junction (MTJ) coupled to a first reference bit line, the first reference MTJ having a parallel magnetic orientation;

a second reference cell in a second array of reference cells, the second reference cell including a second reference MTJ coupled to a second reference bit line, the second reference MTJ having the parallel magnetic orientation;

a third reference cell in a third array of reference cells, the third reference cell including a third reference MTJ coupled to a third reference bit line, the third reference MTJ having the parallel magnetic orientation;

a word line coupled to the first reference cell, the second reference cell and the third reference cell; and programmable switching circuitry configured to simultaneously couple the first reference bit line, the second reference bit line and the third reference bit line to a merged reference node to generate a merged reference level on the merged reference node or to selectively de-couple the first reference bit line from the merged reference node and to simultaneously couple the second reference bit line and the third reference bit line to the merged reference node to generate the merged reference level on the merged reference node.

2. The memory apparatus of claim 1, further comprising:

first sense amplifier circuitry coupled to the merged reference node;

a first data cell including a first data MTJ coupled to the word line and to a first data bit line;

a second data cell including a second data MTJ coupled to the word line and to a second data bit line; and first multiplexer circuitry coupled to the first data bit line and to the second data bit line, the first multiplexer circuitry configured for selectively coupling the first data bit line or the second data bit line to the first sense amplifier circuitry.

3. The memory apparatus of claim 2, further comprising:

second sense amplifier circuitry coupled to the merged reference node;

a third data cell including a third MTJ coupled to the word line and to a third data bit line;

a fourth data cell including a fourth data MTJ coupled to the word line and to a fourth data bit line; and second multiplexer circuitry coupled to the third data bit line and to the fourth data bit line, the second multiplexer circuitry configured for selectively coupling the third data bit line or the fourth data bit line to the second sense amplifier circuitry.

4. The memory apparatus of claim 1, in which the programmable switching circuitry further comprises:

a pass gate coupled between the first reference bit line and the merged reference node; and a programmable device configured for enabling or disabling the pass gate.

5. The memory apparatus of claim 4, further comprising:

logic circuitry coupled between the programmable device and the pass gate; and a block enable node coupled to the logic circuitry;

the logic circuitry configured for passing or inverting a pass gate enable signal on the block enable node in response to a programmed state of the programmable device.

6. The memory apparatus of claim 4, in which the programmable device further comprises:

an internal one time programmable (OTP) MTJ device and/or an external OTP MTJ device, and/or a fuse element.

7. The memory apparatus of claim 1, integrated in a mobile phone, a set top box, a music player, a video player, an entertainment unit, a navigation device, a computer, a hand-held personal communication systems (PCS) unit, a portable data unit, and/or a fixed location data unit.

8. A method for reconfiguring a memory, comprising:

identifying a flawed array of reference cells coupled to a reference bit line in a merged bit line system, the merged bit line system comprising a first reference magnetic tunnel junction (MTJ) in the flawed array of reference cells, a second reference MTJ in a first additional array of reference cells simultaneously coupled to a merged reference node and a third reference MTJ in a second additional array of reference cells simultaneously coupled to the merged reference node;

changing a programmed state of a programmable device in response to identifying the flawed array of reference cells; and decoupling the first reference MTJ from the merged reference node in response to the changed programmed state.

9. The method of claim 8, in which changing the programmed state comprises:

programming an internal one time programmable (OTP) magnetic tunnel junction (MTJ) device and/or an external OTP MTJ device, and/or a fuse element.

10. The method of claim 8, further comprising coupling a redundant reference bit line to the merged reference node in response to the changed programmed state, the redundant reference bit line coupled to a redundant array of reference cells.

11. The method of claim 8, further comprising integrating the memory in a mobile phone, a set top box, a music player, a video player, an entertainment unit, a navigation device, a computer, a hand-held personal communication systems (PCS) unit, a portable data unit, and/or a fixed location data unit.

12. A memory apparatus, comprising:

means for identifying a flawed array of reference cells coupled to a reference bit line in a merged bit line system, the merged bit line system comprising a first reference magnetic tunnel junction (MTJ) in the flawed array of reference cells, a second reference MTJ in a first additional array of reference cells simultaneously coupled to a merged reference node and a third reference MTJ in a second additional array of reference cells simultaneously coupled to the merged reference node;

means for changing a programmed state of a programmable device in response to identifying the flawed array of reference cells; and means for decoupling the first reference MTJ from the merged reference node in response to the changed programmed state.

13. The memory apparatus of claim 12, integrated in a mobile phone, a set top box, a music player, a video player, an entertainment unit, a navigation device, a computer, a hand-held personal communication systems (PCS) unit, a portable data unit, and/or a fixed location data unit.

14. A computer program product for reconfiguring a memory, comprising:

a non-transitory computer-readable medium having non-transitory program code recorded thereon, the program code comprising:

program code to identify a flawed array of reference cells coupled to a reference bit line in a merged bit line system, the merged bit line system comprising a first reference magnetic tunnel junction (MTJ) in the flawed array of reference cells, a second reference MTJ in a first additional array of reference cells simultaneously coupled to a merged reference node and a third reference MTJ in a second additional array of reference cells simultaneously coupled to the merged reference node;

program code to change a programmed state of a programmable device in response to identifying the flawed array of reference cells; and program code to decouple the first reference MTJ from the merged reference node in response to the changed programmed state.

15. The computer program product of claim 14, further comprising integrating the memory in a mobile phone, a set top box, a music player, a video player, an entertainment unit, a navigation device, a computer, a hand-held personal communication systems (PCS) unit, a portable data unit, and/or a fixed location data unit.

16. A method for reconfiguring a memory, comprising steps for:

identifying a flawed array of reference cells coupled to a reference bit line in a merged bit line system, the merged bit line system comprising a first reference magnetic tunnel junction (MTJ) in the flawed array of reference cells, a second reference MTJ in a first additional array of reference cells simultaneously coupled to a merged reference node and a third reference MTJ in a second additional array of reference cells simultaneously coupled to the merged reference node;

changing a programmed state of a programmable device in response to identifying the flawed array of reference cells; and decoupling the first reference MTJ from the merged reference node in response to the changed programmed state.

17. The method of claim 16, further comprising the step of integrating the memory in a mobile phone, a set top box, a music player, a video player, an entertainment unit, a navigation device, a computer, a hand-held personal communication systems (PCS) unit, a portable data unit, and/or a fixed location data unit.

* * * * *